United States Patent
Onachilla et al.

(10) Patent No.: US 7,468,674 B2
(45) Date of Patent: Dec. 23, 2008

(54) VOLTAGE SENSING HAND TOOL

(75) Inventors: Michael D. Onachilla, Menomonee Falls, WI (US); Patrick J. Radle, Mequon, WI (US); Daryl C. Brockman, Shorewood, WI (US); David L. Wiesemann, Pewaukee, WI (US); George R. Steber, Mequon, WI (US); Thomas M. Luebke, Menomonee Falls, WI (US)

(73) Assignee: Actuant Corporation, Glendale, WI (US)

( * ) Notice: Subject to any disclaimer, the term of this patent is extended or adjusted under 35 U.S.C. 154(b) by 174 days.

(21) Appl. No.: 11/458,596

(22) Filed: Jul. 19, 2006

(65) Prior Publication Data
US 2007/0159739 A1    Jul. 12, 2007

Related U.S. Application Data

(63) Continuation-in-part of application No. 11/005,187, filed on Dec. 6, 2004, now Pat. No. 7,295,130, which is a continuation-in-part of application No. 10/808,291, filed on Mar. 24, 2004, now Pat. No. 6,844,819, which is a continuation of application No. 10/112,446, filed on Mar. 28, 2002, now Pat. No. 6,731,218.

(60) Provisional application No. 60/700,413, filed on Jul. 19, 2005.

(51) Int. Cl.
*G08B 21/00*     (2006.01)

(52) U.S. Cl. .................... 340/660; 340/661; 340/662; 340/654; 7/164

(58) Field of Classification Search ............... 340/660, 340/661, 662, 654, 657, 693.5; 324/76.11, 324/149; 7/164, 107, 108, 167, 165
See application file for complete search history.

(56) References Cited

U.S. PATENT DOCUMENTS

| 1,639,889 | A |   | 8/1927  | Humm            |         |
|-----------|---|---|---------|-----------------|---------|
| 3,337,801 | A |   | 8/1967  | Rinier et al.   |         |
| 4,724,382 | A | * | 2/1988  | Schauerte       | 324/133 |
| 4,736,480 | A |   | 4/1988  | Bohl et al.     |         |
| 5,103,165 | A |   | 4/1992  | Sirattz         |         |
| 5,363,045 | A |   | 11/1994 | Martin et al.   |         |

(Continued)

FOREIGN PATENT DOCUMENTS

DE    20218307    4/2003

(Continued)

OTHER PUBLICATIONS

Applicant's Exhibit A: 1997 Gardner Bender Catalog pages showing Circuit Tester and Screwdriver and Circuit Alert Non-Contact Voltage Tester.

*Primary Examiner*—Toan N Pham
(74) *Attorney, Agent, or Firm*—Quarles & Brady LLP

(57) ABSTRACT

A hand tool and an accessory which provide an alarm signal to a user as the tool or accessory approaches a live electrical wire are disclosed. The hand tool or accessory include a non-contact voltage sensing circuit. As the tool or accessory approaches a live electrical wire, the non-contact voltage sensing circuit detects the voltage, triggering an alarm circuit. The alarm circuit provides a visual or audio signal to the user. The hand tool can be selectively coupled to the tool head.

12 Claims, 15 Drawing Sheets

U.S. PATENT DOCUMENTS

| | | |
|---|---|---|
| 5,877,618 A | 3/1999 | Luebke et al. |
| 5,952,820 A | 9/1999 | Thrasher et al. |
| 6,100,679 A | 8/2000 | McCasland |
| 6,118,270 A | 9/2000 | Singer et al. |
| 6,329,924 B1 * | 12/2001 | McNulty ............ 340/660 |
| 6,377,054 B1 | 4/2002 | Beha |
| 6,424,139 B2 * | 7/2002 | Bystrom et al. ......... 324/149 |
| 6,552,522 B1 | 4/2003 | Zook |
| 6,848,139 B2 * | 2/2005 | Simon et al. ............ 7/127 |
| 2001/0011888 A1 | 8/2001 | Bystrom et al. |
| 2003/0178981 A1 | 9/2003 | Douglas |

FOREIGN PATENT DOCUMENTS

| | | |
|---|---|---|
| EP | 1 336 854 A1 | 8/2003 |
| EP | 1351062 A2 | 10/2003 |
| EP | 1351062 A3 | 8/2006 |
| GB | 2417569 | 3/2006 |
| WO | WO 2004/099630 | 11/2004 |
| WO | 2006062733 A1 | 6/2006 |

* cited by examiner

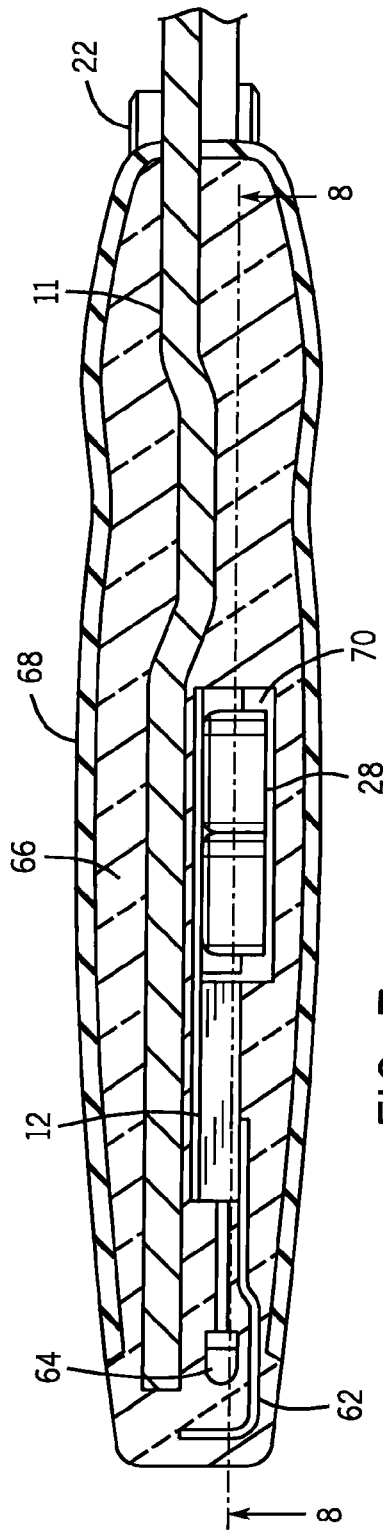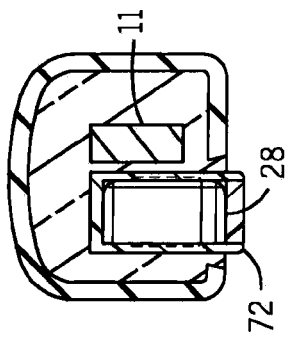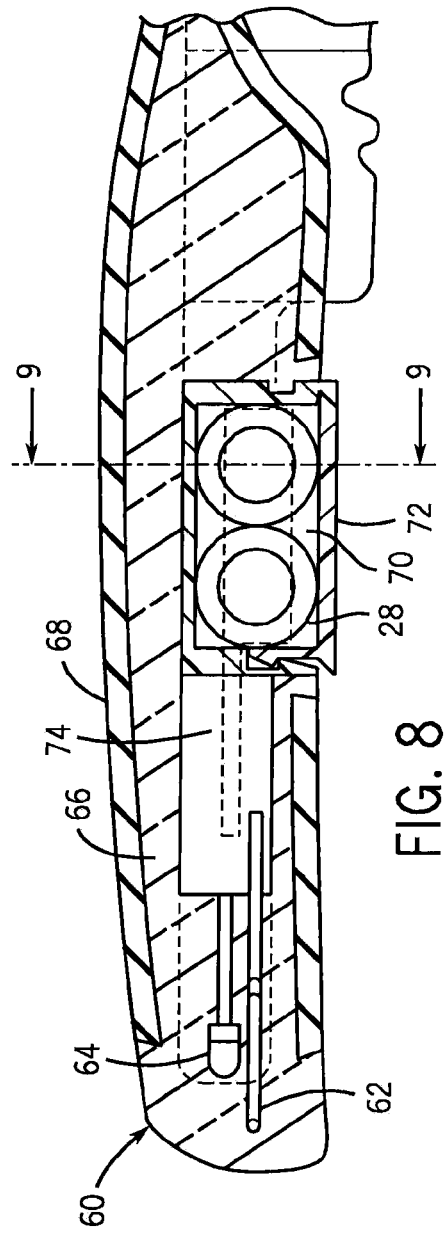
FIG. 7
FIG. 9
FIG. 8

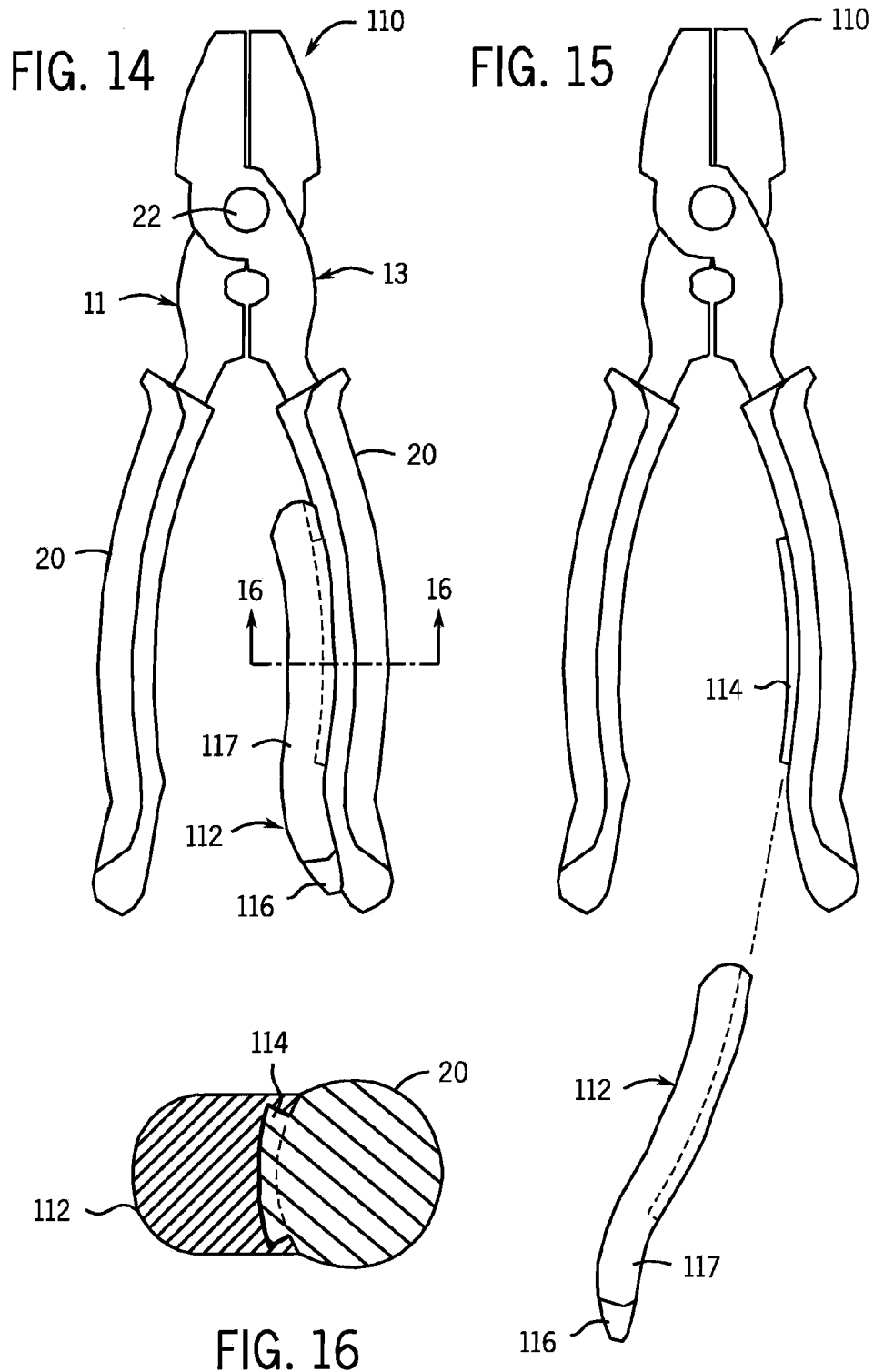

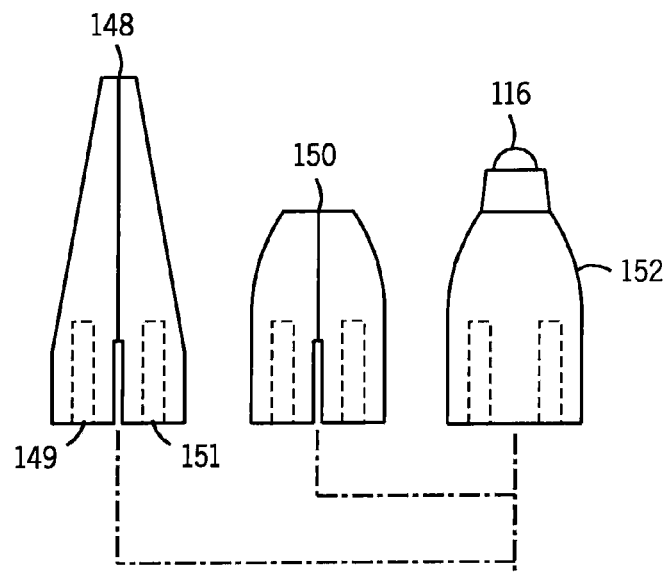
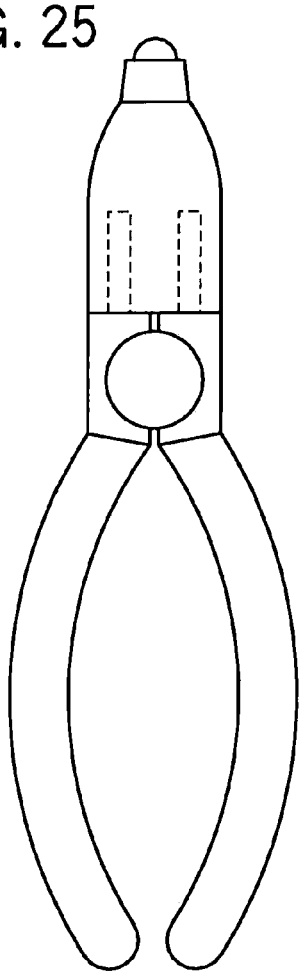
FIG. 25
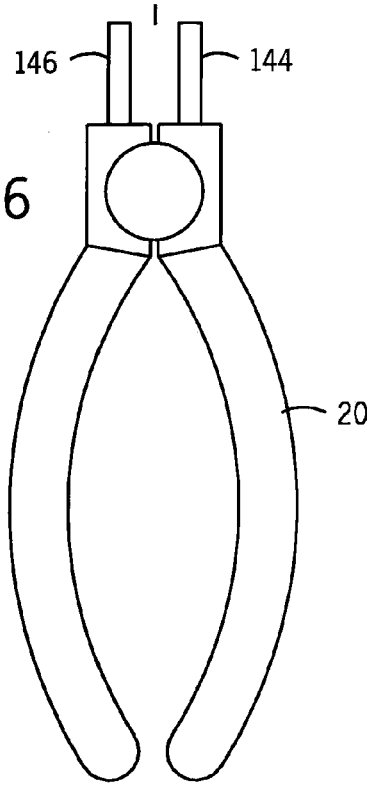
FIG. 26

VOLTAGE SENSING HAND TOOL

CROSS-REFERENCE TO RELATED APPLICATION

This application claims priority to U.S. Provisional Application Ser. No. 60/700,413, filed Jul. 19, 2005, and is a continuation-in-part of U.S. patent application Ser. No. 11/005,187 filed Dec. 6, 2004 now U.S. Pat. No. 7,295,130, which is a continuation-in-part of U.S. patent application Ser. No. 10/808,291 filed Mar. 24, 2004 now U.S. Pat. No. 6,844,819, which is a continuation of U.S. patent application Ser. No. 10/112,446, filed Mar. 28, 2002, now U.S. Pat. No. 6,731,218.

FIELD OF INVENTION

The present invention is generally directed to an electrical sensing tool More particularly, the present invention is directed to a voltage sensing hand tool that includes a non-contact voltage sensing circuit and an associated alarm circuit.

BACKGROUND

Electricians, technicians, maintenance people, and others who work with and around electrical distribution and wiring systems often work in the vicinity of energized electrical panels and wires. Good practice dictates that these electrical circuits be de-energized when work is performed. Not infrequently, however, through error or oversight, these circuits remain in an energized condition during maintenance, thereby presenting an electrical hazard to both the worker and to the associated electrical equipment.

One particular hazard is encountered when conductive hand tools such as wire strippers, cutters, pliers, screwdrivers and such are employed in maintenance procedures. When these hand tools come into contact with the live electrical circuits, they can cause both injury to the worker and damage to the electrical equipment.

Due to these problems, hand held tools that include a voltage meter embedded in the handle have been developed. The voltage meter provides an indication to the user that a voltage is present on the wire and that, therefore, a live wire has been contacted. Such devices, however, require actual, physical contact with the live wire or circuit before the user is alerted. These are useful when the user is probing for a live wire. These devices do not provide a sufficient warning to an unsuspecting user contacting a high voltage circuit to prevent injury or damage. Furthermore, these devices do not provide any indication of contact with a live wire when the wire is insulated.

Also available in the art are non-contact voltage indicators, also useful to probe for a live wire. These indicators provide a visual or audio indicator to the user when the indicator is placed in the vicinity of an AC voltage. An example of a device of this type is shown, for example, in U.S. Pat. No. 5,877,618 "Hand Held Non-Contact Voltage Tester". While useful in providing an indication of a live wire, successful use of this device requires the user to test the wire before work is begun. The test, therefore, does not solve the initial problem: erroneously or mistakenly forgetting to disable or verify disablement of the circuit before work is begun.

Neither of these prior art devices therefore can actively alert the user of the possibility of hazardous voltages on the wires, cables or other electrical devices prior to potentially dangerous contact.

Thus there remains a need for a hand tool that intrinsically alerts a user when the tool is placed in the vicinity of a wire or cable that has a hazardous voltage impressed on it.

SUMMARY OF THE INVENTION

The present invention is a low cost, reliable and easy-to-use hand tool providing an alert signal to a user prior to contacting a live wire. The device of the present invention either permanently or temporarily integrates a non-contact voltage alert circuit and associated alarm circuitry into a hand tool, thereby providing a high degree of safety for the user. The alarm circuitry provides a visual or audio signal, alerting the user that contact with a live wire is about to be made.

In one aspect, the present invention provides a hand tool, comprising a tool head, a handle coupled to tool head, and a non-contact voltage sensing circuit coupled to at least one of the tool head and the handle. The non-contact voltage sensing circuit includes at least one indicator providing an alarm signal indicating that the hand tool is in proximity to a live electrical wire.

In another aspect of the invention, a non-contact voltage sensing accessory is provided. The accessory includes a housing, a non-contact voltage sensing circuit received in the housing, and a coupling device for coupling the housing to a tool.

In yet another aspect of the invention, a hand tool is provided comprising a tool head and a handle. The handle is coupled to the tool head to provide a user interface for the tool head. A detachable non-contact voltage sensing accessory is adapted to be coupled to at least one of the tool head and the handle, and comprises a housing, a non-contact voltage sensing circuit received in the housing, and at least one indicator providing an alarm signal indicating that the hand tool is in proximity to a live electrical wire.

Other features of the invention and advantages will become apparent upon reading the material provided hereafter.

BRIEF DESCRIPTION OF THE DRAWINGS

FIG. 7 is a view taken along the line 7-7 of FIG. 6;

FIG. 8 is a view taken along the line 8-8 of FIG. 7;

FIG. 9 is a view taken along the line 9-9 of FIG. 8;

FIG. 14 is a schematic plan view of a tool, including a detachable non-contact voltage sensing accessory;

FIG. 15 is an exploded view of the tool of FIG. 14 illustrating the detachable accessory as it is removed from the attachment member on the handle of the hand tool;

FIG. 16 is a cut-away view of the handle and voltage sensing attachment taken alone the line 16-16 of FIG. 14;

FIG. 25 is a schematic plan view of a handle, including a tool head attachment member, wherein a non-contact voltage sensing accessory is coupled to the attachment member;

FIG. 26 is an exploded view of the handle of 25 illustrating three separate tool heads that can be removably attached to the attachment members extending from the handle;

DESCRIPTION OF THE EMBODIMENTS

Figure 1:
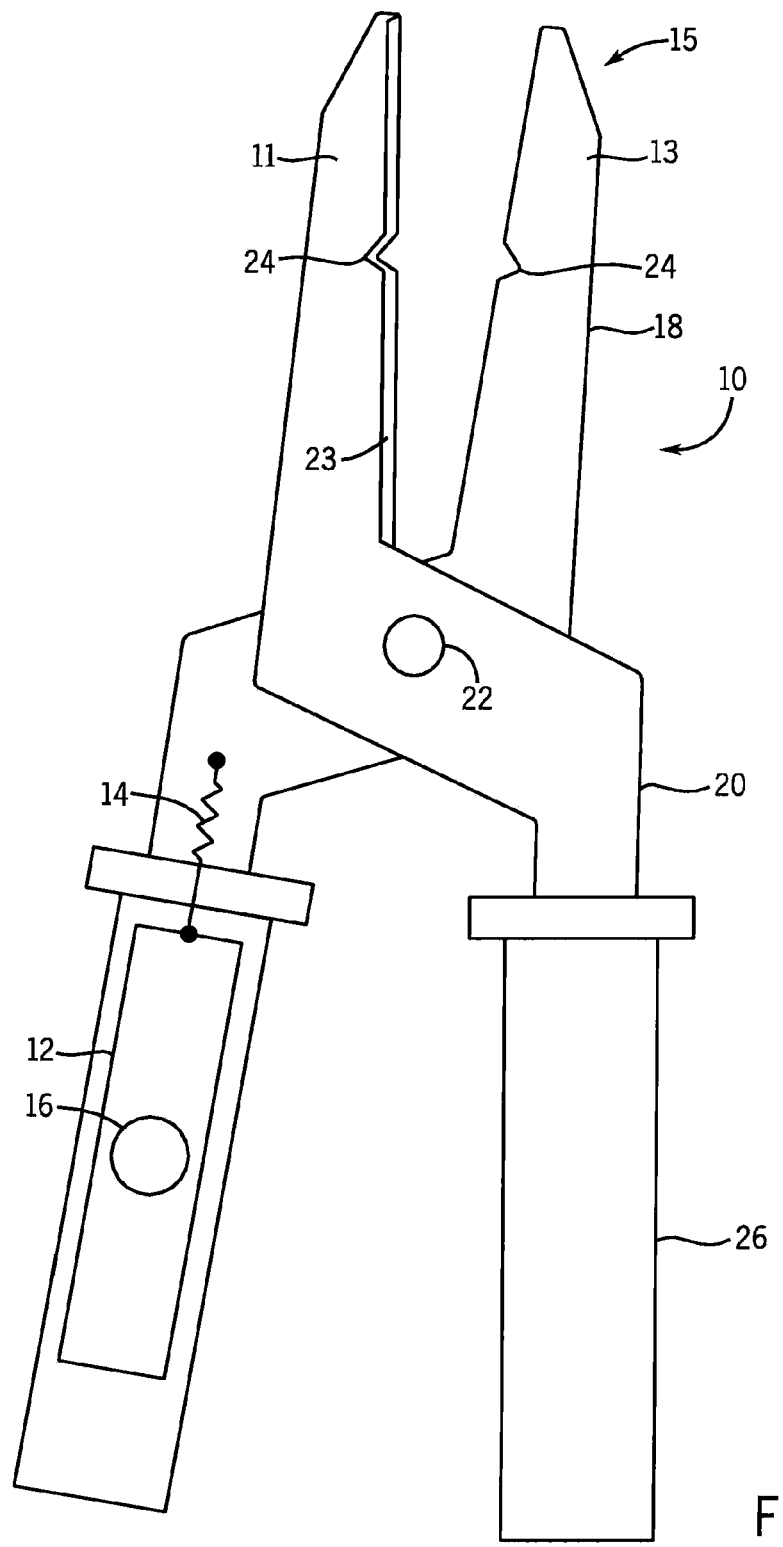
FIG. 1 is a schematic plan view of a tool constructed in accordance with one embodiment of the invention.

Referring now to the figures and more particularly to FIG. 1, a first embodiment of a hand tool 10 constructed in accordance with the present invention is shown. The hand tool 10 generally comprises a functional tool end, hereafter the tool head 15, and one or more handles 20. As shown in FIG. 1, the hand tool 10 can be a wire cutter and stripper, wherein the head end 15 comprises first and second blade elements 11 and 13 rotatably coupled around a fastener 22. Each of the blade elements 11 and 13 comprises a conductive blade 18 and a handle 20. The blades 18 each include a cutting edge 23 for cutting a wire. Each cutting edge 23 includes a generally v-shaped or notched cutting edge 24 which, when the metal blades 18 are pivoted toward each other, provide cutting edges for stripping insulation from a wire. Each of the handles 20 may be an extension of the corresponding blades and is preferably covered with a plastic grip or other non-conductive covering material 26. A non-contact voltage alert circuit 12, which is housed in one of the handles and is coupled to one of the blade elements 11 and 13 through a resistor 14, provides an alert signal to the operator to indicate that the hand tool 10 is physically approaching an electrically live wire, as described below.

Protruding from the handle 20 is a momentary push button switch 16. The push button switch 16 is used to activate or power the non-contact voltage alert circuit 12, and to provide a path to the user's hand from the common ground of the non-contact voltage alert circuit 12. The switch 16 therefore ensures that current flow from a wire travels through resistor 14 and the non-contact voltage alert circuit 12, and not through another path.

Figure 2:
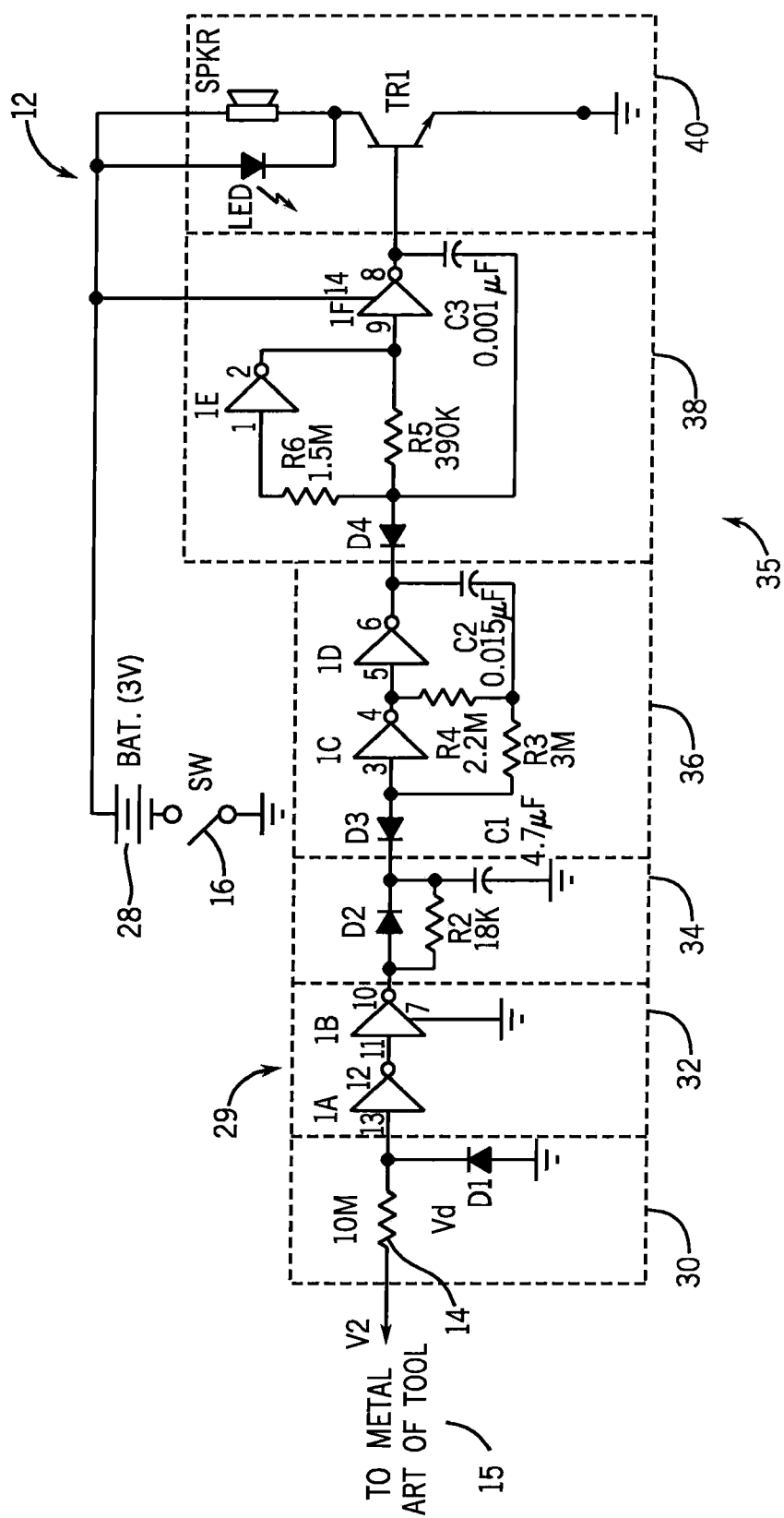
FIG. 2 is a circuit diagram of the voltage alert circuit of FIG. 1.

Referring now to FIG. 2, a circuit diagram of the non-contact voltage alert circuit 12 of FIG. 1 is shown. The non-contact voltage alert circuit 12 generally comprises a trigger circuit 29 for determining when the hand tool 10 is near an energized wire and an alarm circuit 35 for providing an indication to the user. In a preferred embodiment, the trigger circuit 29 comprises voltage divider 30; an inverter circuit 32 and a rectification circuit 34, while the alarm circuit 35 comprises a low frequency oscillator 36; a high frequency oscillator 38; and an alarm activation circuit 40. The voltage alert circuit 12 is activated by the switch 16 which applies power from the battery 28 to the circuit 12, as described above.

Referring still to FIG. 2, the trigger circuit 29 receives an input alternating current (AC) voltage, compares the input voltage to a threshold level and activates the alarm circuit 35 when the input exceeds a threshold value. The input voltage provides an indication that the hand tool 10 is near an energized wire as described below with reference to FIG. 5.

The first stage of the trigger circuit 29 is the voltage divider 30, comprising resistor 14 which receives an input voltage $V_2$ indicative of the proximity of the tool to a live wire, and a diode D1 coupled between the output of the resistor 14 and ground. The voltage divider 30 reduces the voltage $V_2$ to a level suitable for use in conjunction with the digital circuitry described below. As a function of the applied voltage $V_2$, the voltage across D1 varies from substantially zero when the hand tool 10 is not in proximity with a live electrical wire, to a threshold value of a few volts when the hand tool 10 is near a live wire, as described below. The value of the resistor 14 is selected to prevent excessive current flow through the non-contact voltage alert circuit 12 when the hand tool 10 touches a live wire, while also providing a relatively small voltage drop, but assuring that sufficient voltage is provided to activate the non-contact voltage alert circuit 12. For an expected input voltage provided by a wire operating in the range between 120 and 220 VAC, the resistor R1 typically has a value of 10 Mega Ohms.

The voltage across diode D1 provides an input signal to the inverter circuit 32, which comprises CMOS logic inverter gates 1A and 1B. The gate 1A switches between a logic high and a logic low state as the voltage across the diode D1 reaches a threshold value, typically in a range between one and two volts. As noted above, the voltage across D1 and, therefore, the input voltage to the inverter 1A varies with the distance between the hand tool 10 and a live electrical wire. When the hand tool 10 is not near a live wire, the voltage across diode D1 is substantially zero and therefore below the threshold voltage. In this state, the output of inverter gate 1A will be high because of the inverting action of the logic gate. When the hand tool 10 is placed near a live wire with a voltage impressed on it, the voltage across D1 rises above the threshold voltage to trip the inverter 1A causing the output of inverter 1A to go low. A logic low output from inverter 1A therefore indicates that a voltage is being sensed by the hand tool 10. The second inverter, 1B, buffers and inverts the signal, thereby providing a logic high output signal from the inverter circuit 34 when the tool 10 is near a live wire.

The output of inverter 1B is received by the rectifying circuit 34, which converts the alternating voltage signal to a direct current (DC) voltage using a typical rectifying circuit comprising diode D2, resistor R2, and capacitor C1. The rectifying circuit 34 provides a DC voltage across capacitor C1, therefore, only when the hand tool 10 is near an energized live wire.

The output of the rectifying circuit 34 is received by the alarm circuit 35, which provides a visual or audio signal to the user, as described below. In a preferred embodiment of the invention, the alarm circuit comprises low and high frequency oscillator circuits 36 and 38.

The low frequency oscillator circuit 36 comprises logic inverters 1C and 1D, along with associated components D3, R3, R4, and C2. The low frequency oscillator circuit 36 is activated or enabled when a DC voltage is present on capacitor C1. When activated, the low frequency oscillator produces an output signal having a frequency in the range of 1 to 5 Hertz.

The output signal of the low frequency circuit 36 enables the high frequency oscillator 38, comprising logic inverters 1E and 1F and the associated components R6, D4, R5, and C3. The high frequency oscillator 38 produces an output signal in an audio frequency range. The output of the oscillator 38 drives the alarm activation circuit 40 by activating transistor TR1, which in turn is connected to a speaker SPKR and an LED. Hence, when the hand tool 10 is placed near an energized WIRE, the LED is activated and the speaker will produce a sound in the audio range produced by the oscillator 38.

Although the alarm circuit 35 has been described to include oscillators 36 and 38, a number of different alarm circuits can be constructed to provide similar functions. For example, if only a visual indicator such as the LED is used, a transistor switch to an LED can be used. Other alarm circuits will be apparent to those of ordinary skill in the art.

As noted above, the battery 28, which preferably provides a 3V DC power supply, powers the circuit. The negative terminal of the battery 28 is connected to circuit common or ground through the switch 16 and, therefore, the switch 16 must be activated to energize the circuit. When the user's hand pushes switch 16, it energizes the alert circuit 12, thereby enabling the alarm circuit 35 to be activated. As noted above, the switch 16 also provides an electrical path from the circuit common or ground to the user's body and through the user down to the ground.

Figure 3:
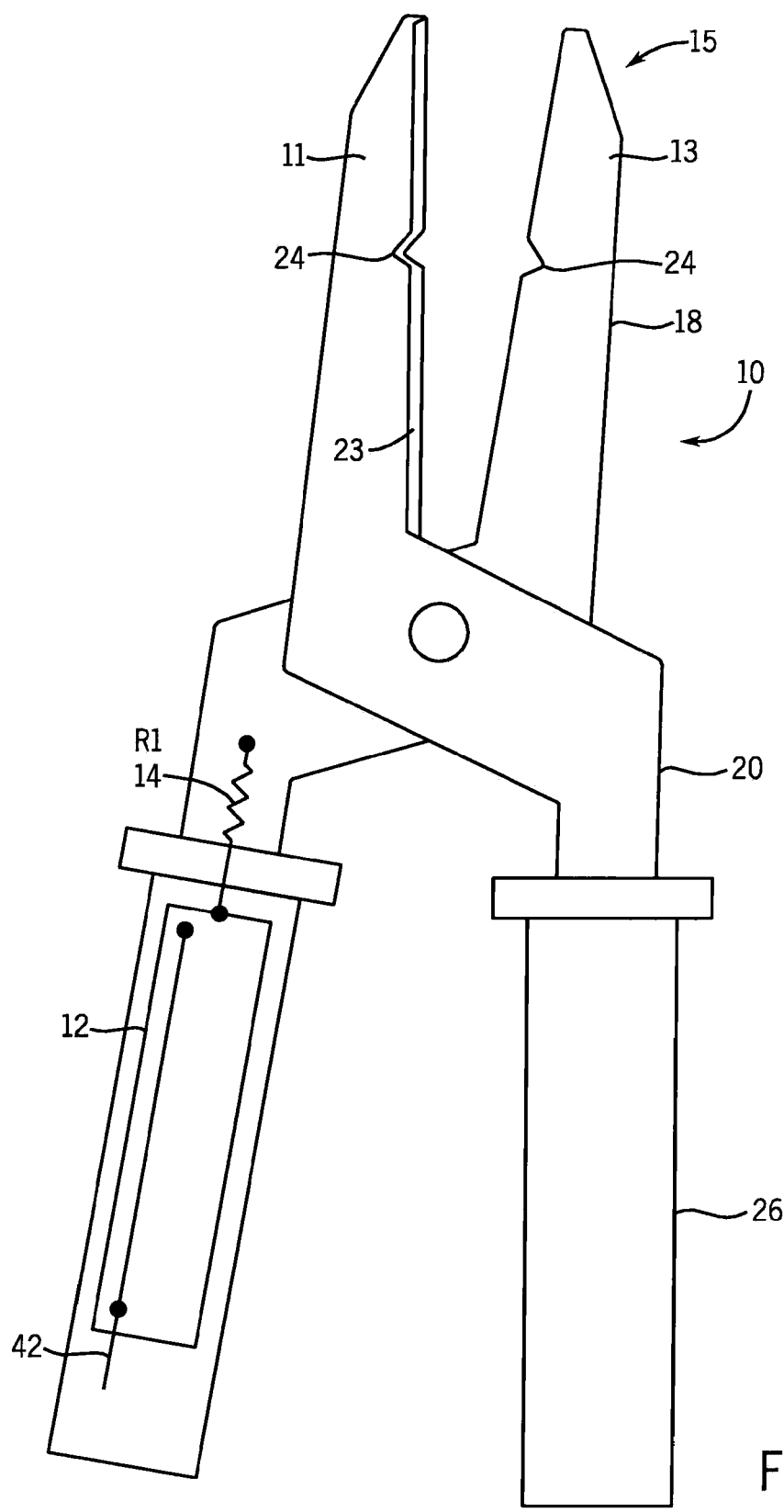
FIG. 3 is a schematic plan view of a tool constructed in accordance with a second embodiment of the invention.
Figure 4:
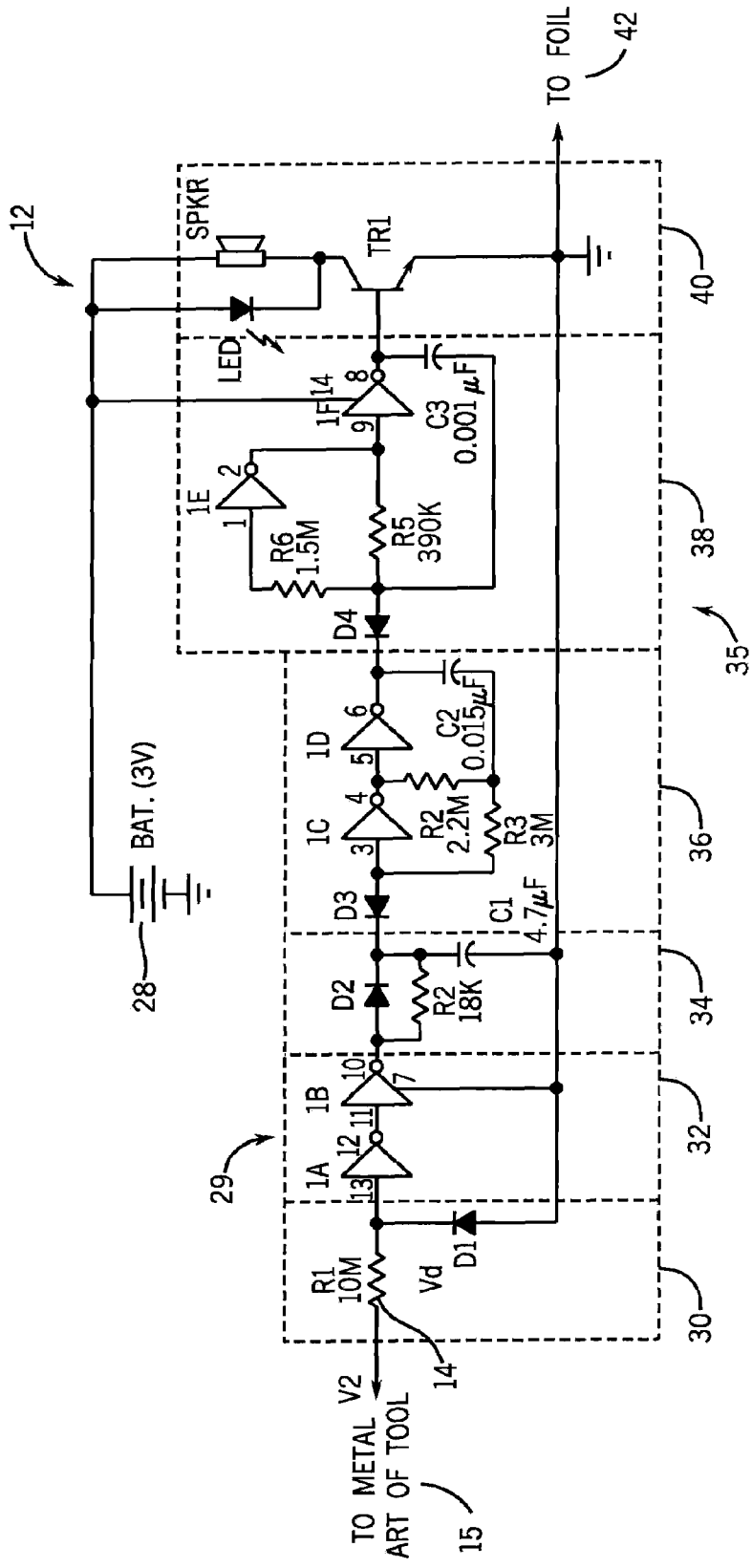
FIG. 4 is a circuit diagram of the voltage alert circuit of FIG. 3.

Referring now to FIG. 3, a second embodiment of a hand tool 10 constructed in accordance with the present invention is shown. Again the hand tool 10 is a wire stripper wherein like elements to those of FIG. 1 are numbered in accordance with the description of FIG. 1. The hand tool 10 of FIG. 3, however, does not include the push button 16 described above but rather includes a metal foil 42 inside the plastic covered handle 26. Referring now also to FIG. 4, a circuit diagram of the hand tool of FIG. 3 is shown, wherein elements are numbered in accordance with the description of FIG. 2, above. It can be seen that the metal foil 42 is coupled to the circuit common or ground of the voltage alert circuit 12. The metal foil 42 provides capacitive coupling to a user's hand and a conductive path for electrical current induced in the hand tool 10, thereby insuring that the current flow from the live electrical wire is through resistor 14 and the voltage alert circuit 12 and not via another path. As noted above, in this application there is no switch 16. Therefore, the circuit 12 is constantly energized. In this application, therefore, low powered CMOS devices are used, thereby allowing the battery to last a long time.

Figure 5:
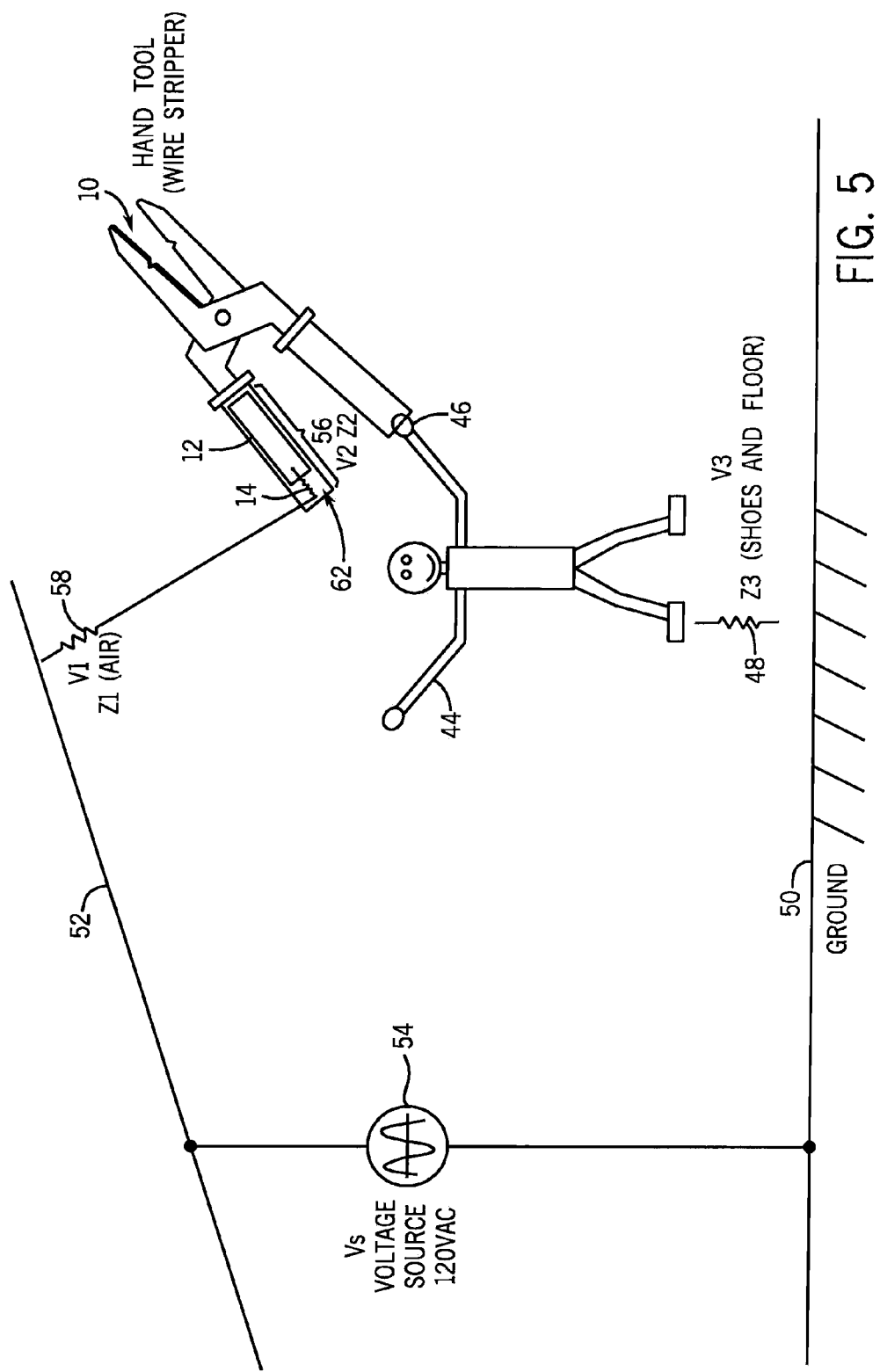
FIG. 5 is a circuit diagram illustrating the use of the tools of FIGS. 1 and 3.

Referring now to FIG. 5, in operation a user 44 grips the handles 20 of the hand tool 10 in a hand 46 to cut or strip insulation from a wire 52. The wire 52 is electrically coupled to a voltage source 54 provided between the wire 52 and ground 50. The voltage source 54 is typical of those encountered in home or business electrical wiring, and can be, for example, a voltage supply operating in the range of 120 or 220 volts AC at either 50 or 60 Hertz, or in various other voltage source configurations used in electrical supply configurations. As the hand tool 10 approaches the energized wire, the user 44 is coupled to the energized wire 52 through a first impedance 58 caused by the air gap between the energized wire 52 and a second impedance 56 from the resistor 14 and voltage alert circuitry 12 in the insulated handle of the tool. The user 44 is further coupled to ground 50 through an impedance 48 comprising generally an impedance from the shoes of the user 44 and the floor of the installation environment. Therefore, a complete circuit exists from the power source 54, through the wire 52, through the air to the tool 10, from the tool 10 to the user 44 and through the user 44 to ground 50, which is the ground of the voltage source 54.

Based on Kirchoff's law, which states that the sum of the voltage rises (sources) must equal the sum of the voltage drops around a closed loop circuit, the voltage drops across the impedances 48 (V3), 56 (V2), and 58 (V1) add to be substantially equivalent to that of the voltage source 54 (Vs), such that Vs=V1+V2+V3. Here, the voltage drop across the body of the user 44 is neglected, as the impedance of the human body is comparatively very low. It should be clear from FIG. 5 that the impedances 58, 56, and 48 and the associated voltage drops V1, V2, and V3 can vary widely as the hand tool 10 is moved about in the vicinity of the wire 52.

If the hand tool 10 is far from the wire 52, the voltage V1 is substantially equivalent to that of the voltage source 54 because the impedance 58 of the air gap is much larger than that of the other impedances. As the hand tool 10 is moved closer to the wire 52, the impedance 58 becomes smaller and current begins to flow in the circuit. If the impedance 56 across the hand tool 10 is large, a voltage drop V2 will occur. As the voltage drop V2 rises above a threshold level, the trigger circuit 29 of the non-contact voltage alert circuit 12 will be activated as described above, thereby causing visual and/or audible signals to be provided to the user 44.

If the hand tool 10 touches the wire 52, V1 becomes small and most of the voltage 54 is across the hand tool impedance 56 and floor impedance 48. To prevent a hazard to the user 44 under such circumstances, the impedance 56 of the hand tool 10, and particularly resistor 14, is selected to prevent a large current flow, as described above.

Although the hand tool 10 has been described as a wire cutter and stripper, other types of hand tools including pliers, screw drivers, wrenches, wire cutter, wire stripper, and other tools can be provided with an alert circuit 12. In each of these applications, the tool head 15 is designed to provide the expected function. For example, in a screw driver the tool head 15 can comprise a straight blade or Phillips head screw driver. In a pliers, the tool head 15 comprises two pivoted arms. Other tool heads will be apparent to those of ordinary skill in the art. Furthermore, although the wire 52 has been described as an insulated wire, the wire 52 can also be a bare wire, without requiring a change to the sensing circuit. Additionally, although specific embodiments of the non-contact voltage alert circuit 12 have been described, it will be apparent that various types of alert and alarm circuitry can be employed.

Figure 6:
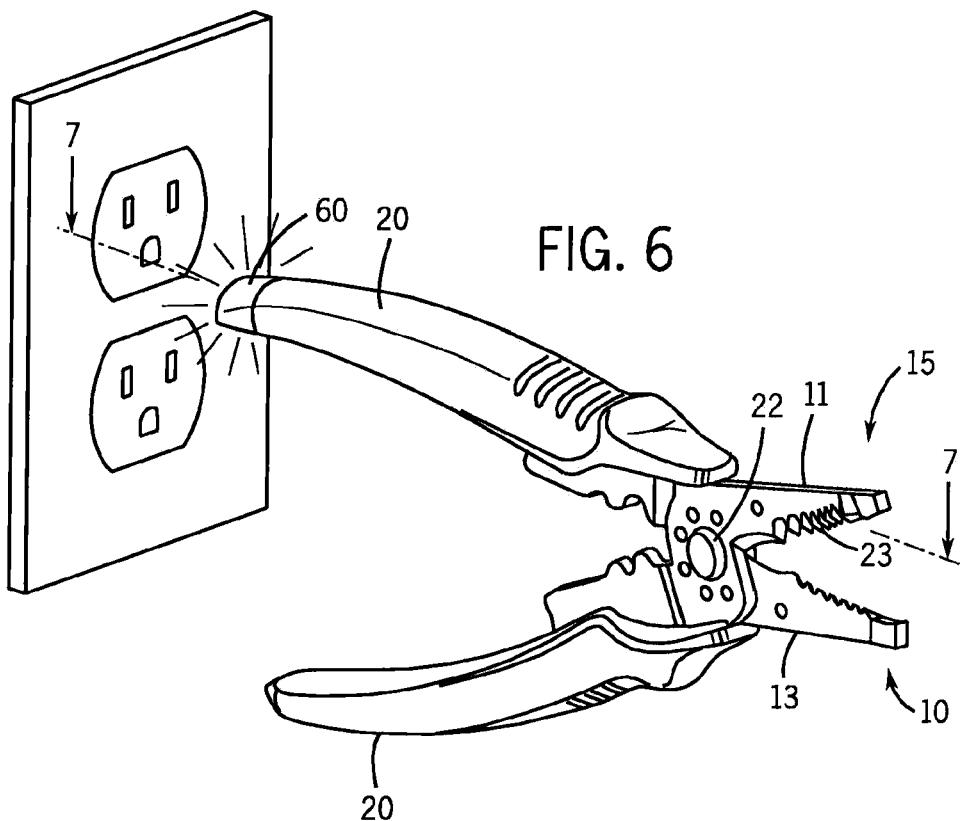
FIG. 6 is a schematic plan view of a tool constructed in accordance with another embodiment of the invention.

Referring now to FIG. 6 an alternate embodiment of a hand tool 10 constructed in accordance with the present invention is shown. As described above, the hand tool 10 comprises a tool head 15 coupled to at least one handle 20. As shown, the tool head 15 is a wire stripper including blades 11 and 13 coupled through a rotational fastener 22. First and second handles 20 are provided on the strippings that include the blades 11 and 13 as is ordinary in strippers and other types of pliers. However, as described above, the tool head 15 can be constructed to provide any number of different types of tools including, for example, a screw driver, a pliers, a wrench, a wire cutter, a wire stripper, or other heads designed to work a work piece. Although the blades 11 and 13 are described above as conductive, in the embodiment shown here the blades 11 and 13 or any other tool head 15 can be constructed of a non-conductive material such as a plastic.

Figure 11:
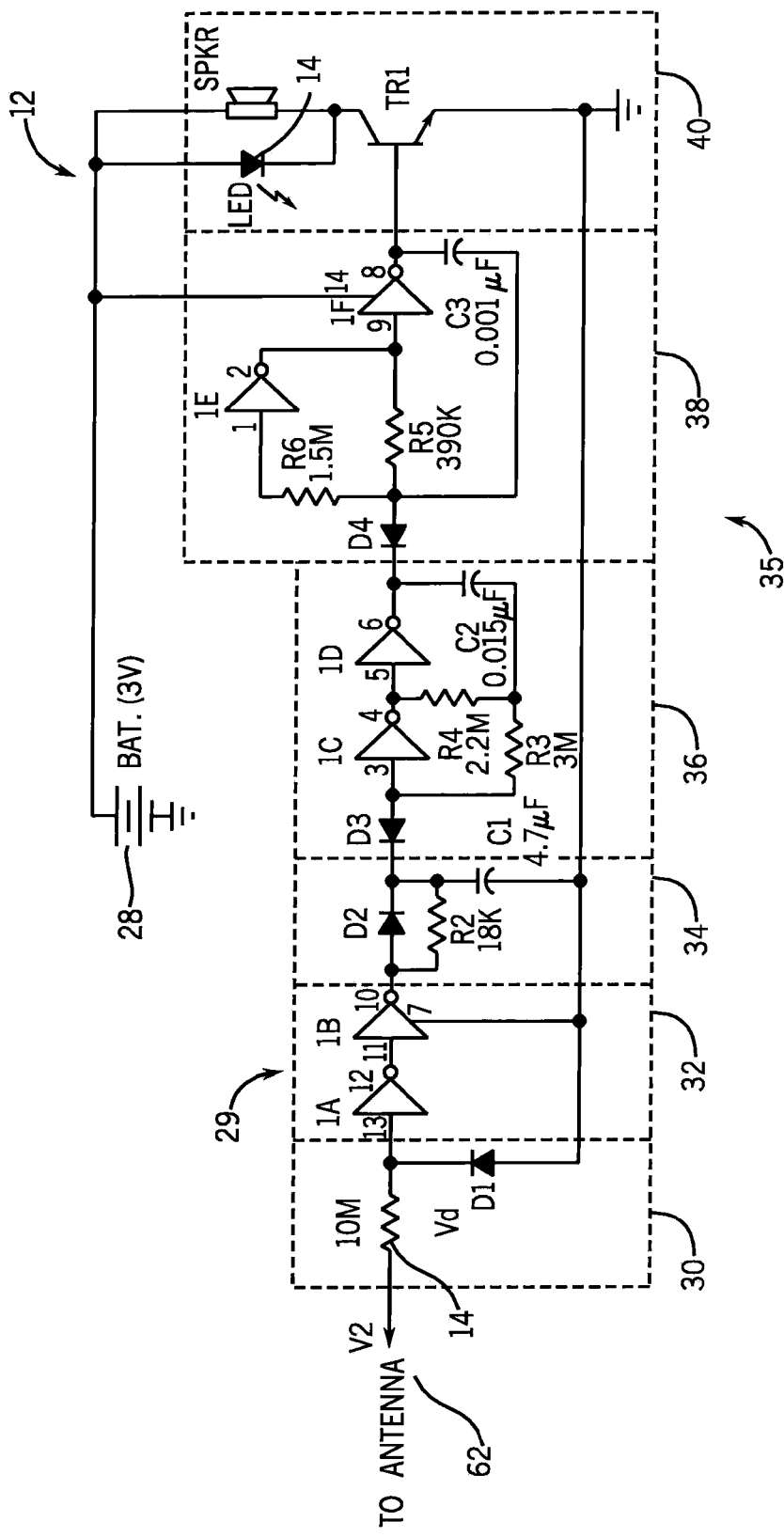
FIG. 11 is a circuit diagram illustrating the non-contact voltage sensing circuit of the embodiment of FIG. 6.

Referring now also to FIG. 7, a cutaway side view of the handle of the hand tool 10 of FIG. 6 taken along line 7-7 is shown. The handle 20 includes a non-contact voltage sensing circuit 12 (FIG. 11) which is functionally equivalent to the circuit 12 of FIG. 4, as described above, but includes an antenna 62 in place of the connection to the conductive tool head 18 of the hand tool so that the circuit 12 of FIG. 11 is not electrically connected to the tool head 15 but is electrically insulated from it. The handle 20 is constructed of a non-conductive material such as a plastic material 66, and the portion of the handle 20 that is intended to be gripped by a user is encased in an outer rubber molding 68 that can be, for example, a thermoplastic rubber (TPR) or other rubberized material. An indicator portion 60 of the handle 20, here shown at the distal end of the handle 20, comprises a translucent material, such as a translucent plastic, and is positioned adjacent a light indicator such as, referring now also to FIG. 11, a light emitting diode 64 coupled to the non-contact voltage sensing circuit 12. The non-contact voltage sensing circuit 12 is retained in a cavity 74 molded or otherwise provided in the handle 20 and can include, as described above with reference to FIGS. 2 and 4, a speaker SPKR or other sound transducer for emitting a sound when activated by the alarm circuit 40, also as described above. The antenna 62 is further provided in the handle 20 and is coupled to the input resistor 14 of the non-contact voltage sensing circuit 12 shown in FIG. 11 to sense an alternating current electric field. The batteries 28 for powering the circuit 12 are provided in a separate cavity 70 molded or otherwise provided in the handle 20.

Figure 10:
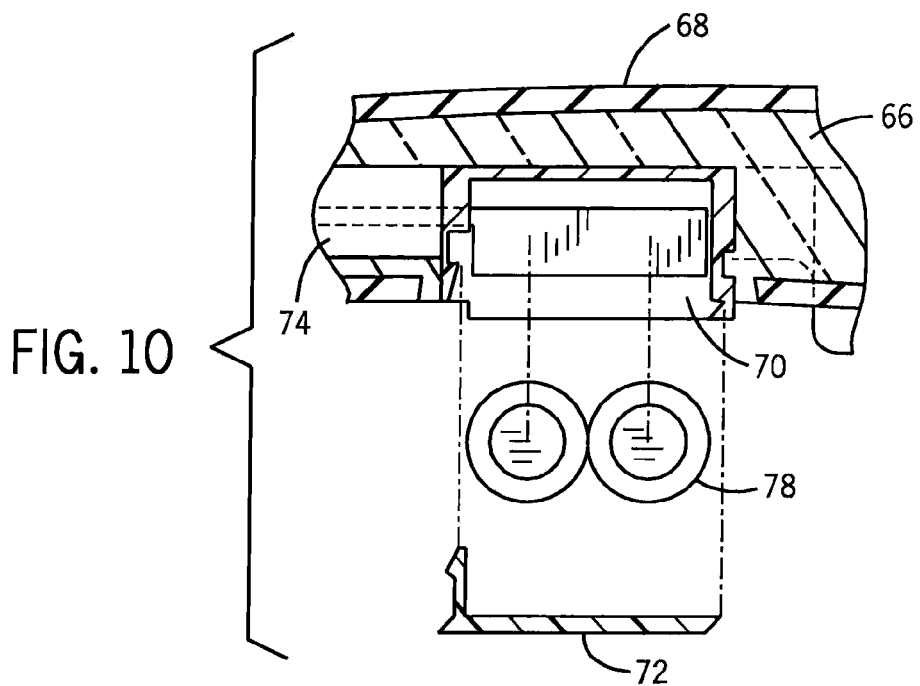
FIG. 10 is a partial cutaway view of the hand tool of FIG. 6 showing an exploded view of the battery compartment.

Referring now to FIGS. 8, 9, and 10, the batteries 28 can be provided in an open cavity 70 formed in the handle 20 and adjacent a removable door 72 which can be, for example, snap-fit into the outer edge of the cavity 70 to provide selective access to the batteries 28. Alternatively, however, non-replaceable batteries 28 can be provided within the handle 20 and the handle 20 can be molded around the batteries 28 without providing access to the batteries.

Referring again to FIG. 6, in operation, when the handle 20 is positioned near a live electrical AC power supply, such as the electrical outlet shown, the antenna 62 in the handle 20 detects the AC electrical signal which is then directed to the non-contact voltage sensing circuit 12. The non-contact voltage circuit 12 compares the voltage detected by the antenna 62 to a threshold value as described above with reference to FIGS. 2 and 4, and activates an alarm circuit 40 for providing an indication to the user. As shown, the circuit 12 activates at least one of the light indicator LED 64 or the SPKR provided in the non-contact voltage sensing circuit 12 (FIG. 11). When the LED 64 is activated, the indicator light provides a signal to the user through the translucent indicator portion 60 of the handle 20. By providing the antenna 62 in the handle 20, the embodiment of FIGS. 6-11 eliminates any need to connect the blades 11 or 13 or another tool head 15 to the voltage sensing circuit 12. Therefore, the tool head 18 can be constructed of a non-conductive material, such as a plastic, rather than the conductive material required in the embodiment above.

Although the embodiment of FIGS. 6-11 is described as having an LED 64 located adjacent a translucent plastic material and molded within the handle 20 itself, it will be apparent that a light indicator could also be provided outside of the handle, or connected to the hand tool 10 in various other ways. Furthermore, various methods of providing a battery cavity 70 in the handle and an adjacent access door 72 will also be apparent. Although the construction has been described above as being plastic, various other materials will be suitable for application in the hand tool 10.

In an alternative embodiment, a non-contact voltage detector is provided as part of an accessory that can be selectively coupled to any number of hand tools, and/or to a worker working around electrical equipment, or in other locations in which non-contact voltage sensing is desirable. The accessory can be attached externally to the device using known removable, semi-permanent coupling methods, or be provided inside the handle, head, or body of the tool.

Figure 12:
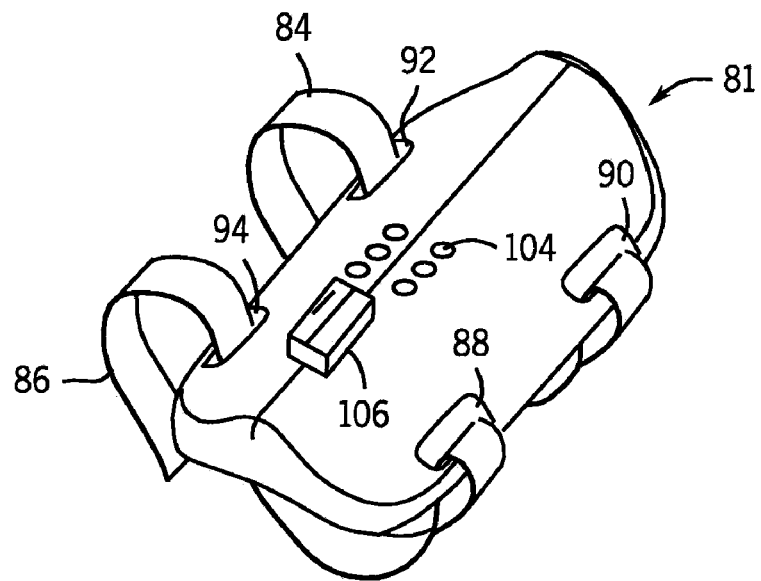
FIG. 12 is a top perspective view of a non-contact voltage detector accessory adapted to be coupled to a number of different tools.

Referring now to FIG. 12, in one embodiment, the accessory 81 includes a housing 80 in which one or more operator indicator is provided along with an actuator switch 106. The operator indicators can include both audio and visual indicators, such as an audio indicator provided through sound or speaker outlets 104, and/or an indicator light 107 such as an LED provided under a lens. Apertures 88, 90, 92 and 94 are provided along the edges of the housing 80 for receiving straps 84 and 86 for coupling the accessory 81 to a desired location. The length of the straps 84 and 86 is adjustable in order to allow the accessory 81 to be coupled to various sized items or devices.

Figure 13:
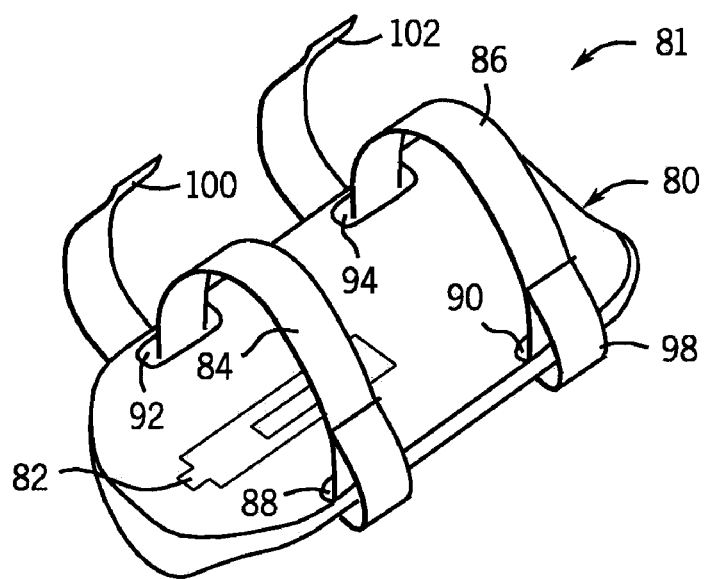
FIG. 13 is a bottom perspective view of the accessory of FIG. 12.

Referring now also to FIG. 13, a battery compartment 82 is provided in the bottom of the housing 80. The straps 84 and 86 include looped ends 96 and 98, respectively, which are received in the apertures 88 and 90 for retaining the straps 84 to the housing 80. The distal ends 100 and 102 of the straps 84 and 86 are threaded through apertures 92 and 94. The ends 100 and 102 can include hook and loop type fasteners and can be coupled directly to the straps 84 and 86. Alternatively, the ends could be tied directly to the straps 84 and 86, or provided with snaps, buckles, or other types of selective fastening devices. Furthermore, although straps are shown, it will be apparent that other types of fastening devices and methods can be used to couple the accessory to a desired location, as discussed below.

Referring still to FIGS. 12 and 13, the housing 80 can be shaped to have an internal surface 108 that is generally concave to simplify the attachment of the accessory 81 to rounded handles, arms, or other devices or elements, particularly the handle 20 (FIG. 1) or tool head 15 (FIG. 1) of a hand tool 10. A non-contact voltage sensing circuit, such as those described above with reference to FIGS. 2, 4, and 11, is provided internally in the housing 80 and can, as described above, include an alarm circuit to activate the indicator lights 107 and/or an audio alarm transmitted through a speaker via sound holes 104.

Referring now generally to FIGS. 14-29, a number of hand tools are shown with various embodiments of detachable non-contact voltage sensing accessories or attachments. In each of the FIGS. 14-29, a tool 110 is shown, including a tool head 15 and one or more handle 20, as described above with reference to FIG. 1. A non-contact voltage sensing accessory, including a housing 117 and a non-contact voltage sensing circuit 12 as described above with reference to FIGS. 2, 4 and 11, is provided in the housing 117. When using the circuit of FIGS. 2 and 4, the input to the non-contact voltage sensing circuit 12 at resistor 14 can be connected directly to a metal wire or other metal contact or component extending from the housing 117, and the metal wire or other contact positioned to provide an electrical contact to the tool head 15, such that the tool head 15 acts as an antenna for the circuit. As one example, the accessory can include a magnetic coupling device which extends from the housing to couple the accessory to a metal tool head, and also provides an antenna connection for the internal circuit. Alternatively, as described above with reference to FIG. 11, the non-contact voltage sensing circuit 12 can be electrically insulated from the tool head 15.

The housing is removably attached to the hand tool 110 using a variety of coupling methods described more fully below. Because the attachment is removably attached to the hand tool, the non-contact voltage sensing accessory can be easily replaced if, for example, the non-contact voltage sensing accessory malfunctions, the battery in the circuit dies, or another problem occurs. The accessory can also be removed if it is desirable to use the hand tool 110 and voltage sensing attachment 112 separately. Although specific hand tool 110 and non-contact voltage sensing circuit accessory combinations and coupling methods are shown below, it will be apparent that various combinations of accessories, tool heads, coupling methods, and handles are possible, and the illustrations provided below should not be construed as limitations of the invention.

Referring now to specifically to FIGS. 14-16, a first embodiment of a non-contact voltage sensing accessory or attachment 112 is shown connected to a handle 20 of a hand tool 110. As shown here, the hand tool 110 is a pliers, including a pair of handles 20, one of which includes an attachment flange 114 extending from a side of the handle 20. The attachment flange 114 is sized and dimensioned to receive a mating slot 115 formed in the housing 117 of the non-contact voltage sensing attachment 112, allowing the voltage sensing attachment 112 to be selectively slid onto the attachment flange 114, as shown specifically in FIG. 16.

Figure 17:
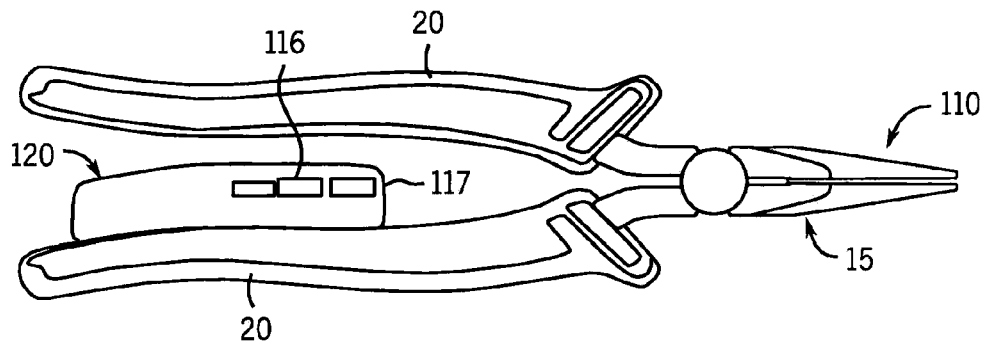
FIG. 17 is an alternate embodiment of a hand tool including a detachable voltage sensing device (illustrated here as a needle nose pliers)
Figure 18:
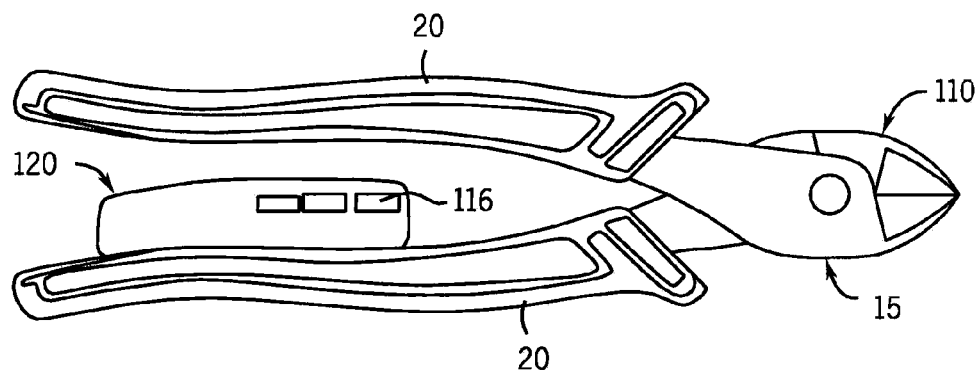
FIG. 18 is a schematic plan view of a wire cutter including the detachable accessory of FIG. 17.
Figure 19:
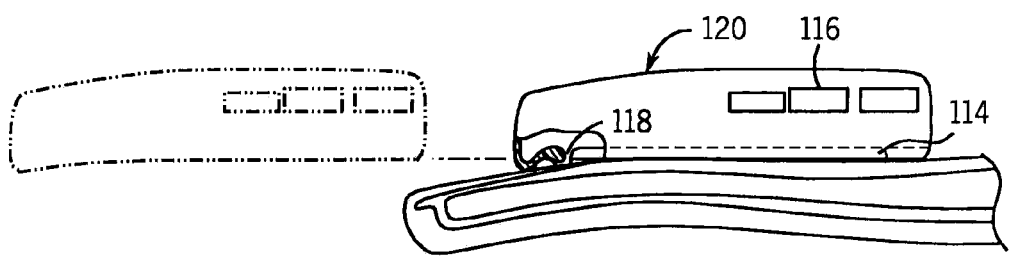
FIG. 19 is an exploded view of the handle of FIGS. 17 and 18 showing the attachment and removal of the accessory.

Referring now to FIGS. 17-19, a second embodiment of a non-contact voltage sensing attachment 120 is shown as coupled to a handle 20 of a hand tool 110. Here, the tool 110 is shown as a needle nose pliers in FIG. 17, and as a wire cutter in FIG. 18. Each of these tools includes an attachment flange 114 protruding from the handle 20. Referring now specifically to FIG. 19, as described above, the voltage sensing attachment 120 includes a mating slot 115 formed in the housing 117 that is sized and dimensioned to be slidably received on the attachment flange 114. Here a mating ridge or "stop" 118 is also provided at the end of the mating slot 115 to limit movement of the attachment beyond the attachment flange 114.

Figure 20:
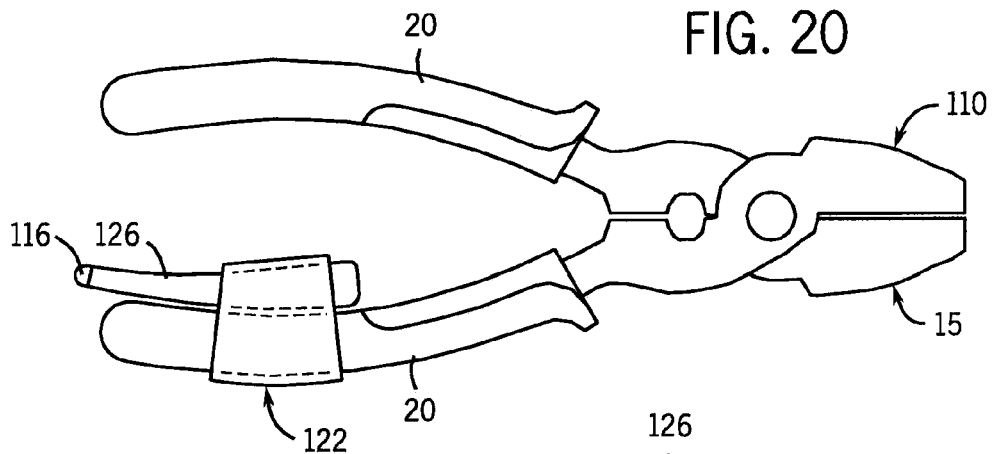
FIG. 20 is a schematic plan view of a hand tool including an attachment member and removable voltage-sensing accessory received in the attachment member.
Figure 21:
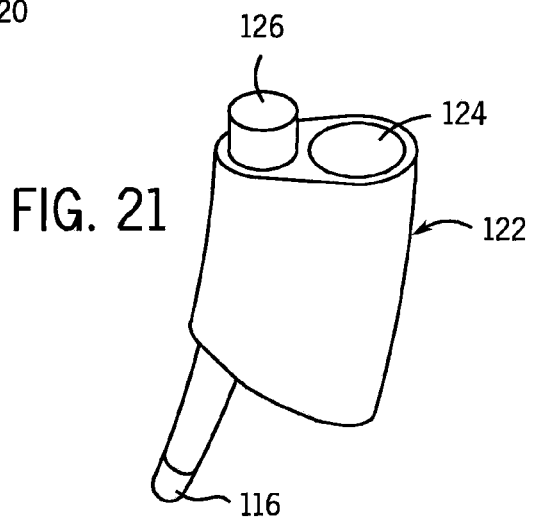
FIG. 21 is a perspective view of the attachment member of FIG. 20, including a removable voltage sensing accessory.

Referring now to FIGS. 20 and 21, another embodiment of a hand tool 110 is shown with an attachment member 122 coupled to the handle 20. The attachment member 122 includes two slots or apertures 124 and 125, the first sized and dimension to receive the handle 20, and the second sized and dimensioned to receive a removable non-contact voltage sensing device 126. The attachment member 122 is slid onto the handle 20 of the hand tool 110, through the aperture 124, and the voltage sensing accessory 126 is slid into the aperture 125 in the attachment member 122. Here, the voltage sensing accessory 126 can be selectively removed from the attachment member 122 for use. Alternatively, the attachment member 122 can be entirely removed from the handle 20.

Figure 22:
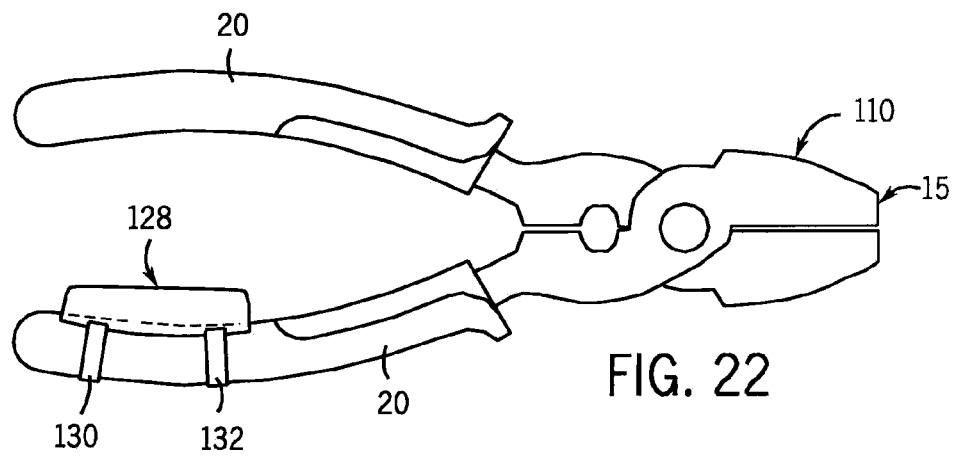
FIG. 22 is a schematic plan view of a hand tool, including an alternate embodiment of a non-contact voltage sensor accessory coupled to a handle of the tool.

Referring now to FIG. 22, an alternate embodiment of a hand tool 110 and non-contact voltage sensing accessory 128 is shown. Here, the hand tool 110 includes a non-contact voltage sensing attachment 128 that is coupled to the handle 20 with first and second straps or attachment members 130 and 132. The attachment members 130 and 132 can be sized and dimensioned to fit to the handle 20 of the tool 110 and can be constructed of various materials including plastic and elastic material, thereby again allowing the accessory 128 to be "slid" onto the handle 20. Alternatively, the attachment members 130 and 132 can be hook and loop fasteners such as Velcro®, or straps that are selectively coupled together using snaps, threaded fasteners, or other fastening devices.

Figure 23:
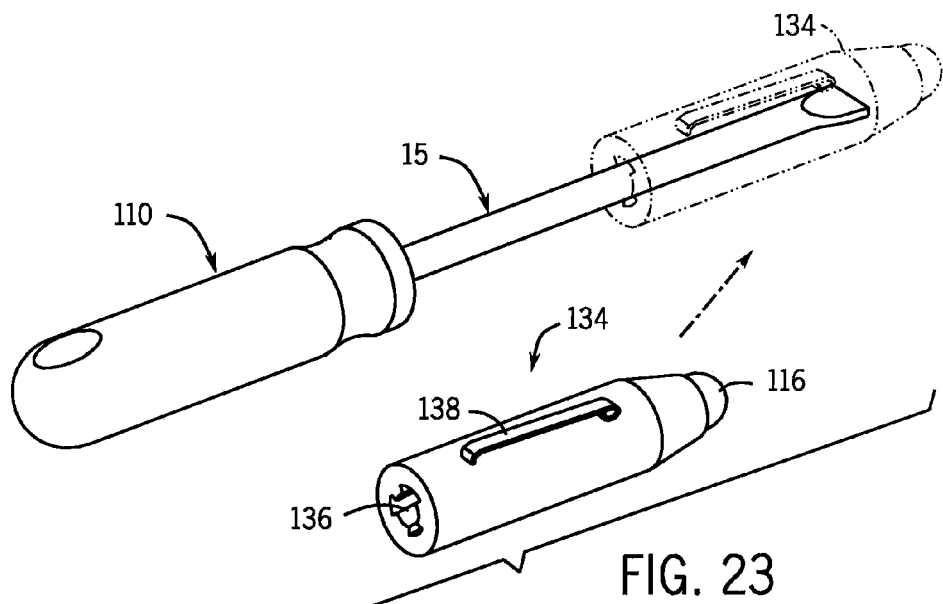
FIG. 23 is an exploded view of a hand tool and voltage sensing accessory that is removably attached to an end of the tool head.

Referring now to FIG. 23, another embodiment of a non-contact voltage sensing accessory 134 constructed in accordance with the present invention is shown. Here, the hand tool 110 is a screwdriver and the voltage sensing accessory 134 includes an aperture 136 sized and dimensioned to be slid over and retained on the tool head 15. The aperture 136, as shown, can include internal projections for providing a tight fit between the accessory attachment 134 and the tool head 15, and can also be constructed using rubber or other gripping materials. The voltage sensing attachment 134 can also include a clip 138 that can be used to removably attach the voltage sensing attachment 134 to a pocket or other location for safekeeping while the hand tool 110 is used separately from the voltage sensing attachment 134.

Figure 24:
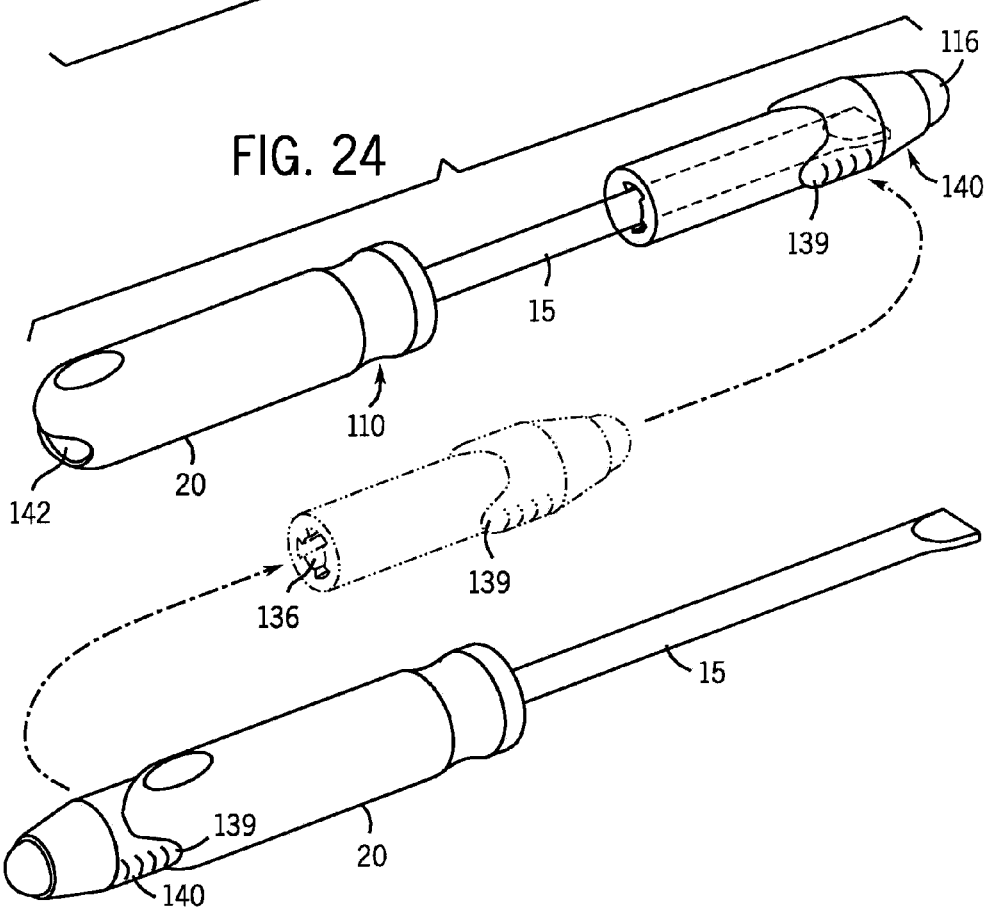
FIG. 24 is an exploded view of a hand tool, including an aperture and a handle for receiving and storing a non-contact voltage sensing accessory.

Referring now to FIG. 24, an alternate embodiment of a voltage sensing accessory attachment as described above with reference to FIG. 23 is shown. Here, the voltage sensing accessory 140 is sized and dimensioned to be received in an aperture 142 in the handle 20 of the screwdriver. The accessory can include a mating flange 139, which is sized and dimensioned to mate with the distal end of the handle 20 adjacent the aperture 142, to limit the movement of the accessory 140 into the aperture 142, and to lock the voltage sensing accessory 140 in position.

Referring now to FIGS. 25 and 26, yet another embodiment of a hand tool 110 and voltage sensing accessory 160 constructed in accordance with the present invention is shown. Here, the hand tool 110 includes one or more handle 20 and tool head attachment members 144 and 146 extending from the ends of the handle 20, substantially forming a plug for receiving a mating socket in a tool head attachment. Various tool head attachments, shown here as a needle nose pliers 148, a wire cutter 150, and a voltage sensing accessory 160 each include a socket comprising apertures 149 and 151 sized and dimensioned to be received on and mate with the tool head attachment members 146 and 144, which as shown here, are blade-like elements extending from each of the handles 20. Various other configurations for providing mating attachment members in opposing components will be apparent to those of skill in the art.

Figure 27:
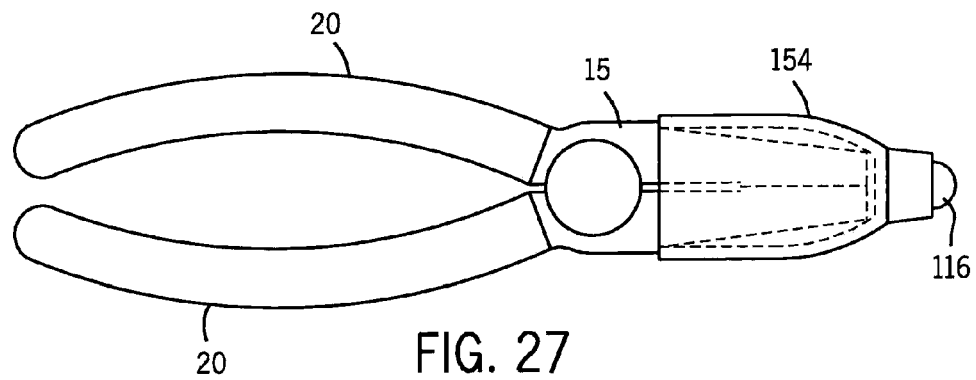
FIG. 27 is a schematic plan view illustrating a hand tool receiving a voltage sensing accessory over the tool head.
Figure 28:
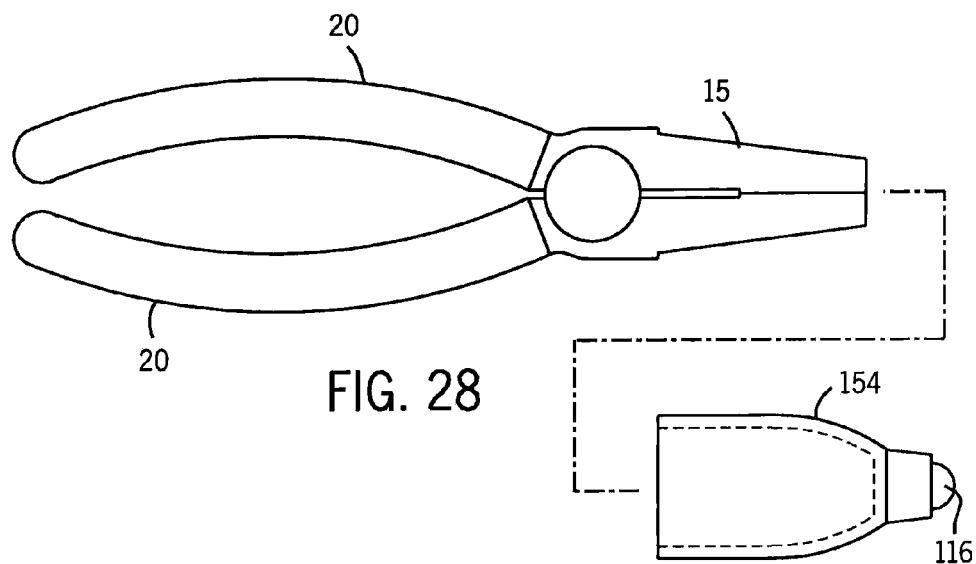
FIG. 28 is an exploded view of the hand tool shown in FIG. 27.

Referring now to FIGS. 27 and 28, an embodiment similar to that of FIGS. 25 and 26 is shown. Here, however, the hand tool 110 includes a tool head 15, shown here as a needle nose pliers, and the voltage sensing attachment member 154 is sized and dimensioned to be received directly on the tool head 15, rather than provided as a separate element.

Figure 29:
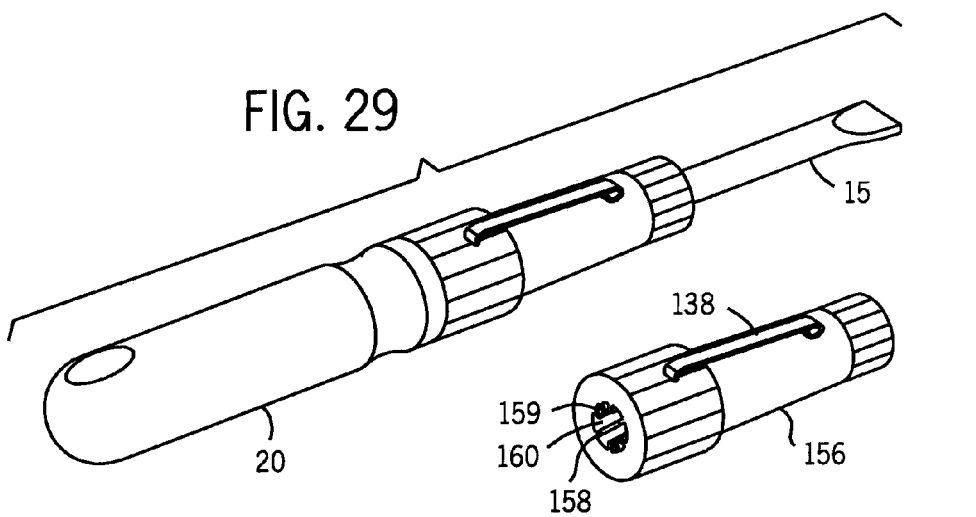
FIG. 29 is an exploded view of a alternate embodiment of a voltage-sensing accessory for receipt on a screwdriver.

Referring now to FIG. 29, yet another embodiment of a hand tool 110 and voltage sensing accessory 156 constructed in accordance with the present invention are shown. Here, the tool head 15 is a screwdriver and the voltage sensing accessory 156 is generally cylindrical in shape and includes a center aperture 158 sized and dimensioned to be received over the screwdriver tool head 15. The aperture 158 includes slots 159 for receiving the flat end of the screwdriver blade, such that the voltage sensing accessory 156 can be slid over and retained on the screwdriver tool head 15 while the screwdriver is in use. As described above with reference to FIG. 23, the voltage sensing accessory 156 can include a clip 138 for use by a worker or operator for retaining the voltage sensing accessory on a pocket or in another storage location. As shown here, a metal contact 160 can extend through the housing in a position selected to contact the tool head. The metal contact 160 is coupled to the resistor 14 in the circuit described above with reference to FIGS. 2 and 4, thereby providing an electrical connection to the tool head 15, wherein the tool head 15 acts as an antenna.

Although specific embodiments of non-contact voltage sensing accessories for attachment to hand tools 110 have been shown and described above, it will be apparent that a number of modifications could be made within the scope of the invention. For example, although specific housings for the voltage sensing accessories are illustrated and described, it will be apparent that the shape of the housing can be modified to mate with various types of tools and coupling devices. Thus, for example, in some applications it will be desirable for the housing to include a flat surface. In other applications, the surface could be concave, convex, or provided in other forms.

Furthermore, although specific methods for coupling the voltage sensing accessory to a tool, other device or body are shown, the accessory described could be coupled to virtually any type of tool using various methods of coupling the accessory. For example, a magnet could be provided in the housing, and the accessory coupled to the surface. Alternatively, a portion of a hook and loop type fastener could be provided on the housing, and a mating portion provided on the tool or other device to which the accessory is to be connected. Furthermore, if a more permanent connection is required, various types of permanent or semi-permanent adhesives could be used to couple the non-contact voltage sensing accessory to a tool. Threaded fasteners, snaps, rivets, and other coupling devices could also be used. Furthermore, the non-contact voltage sensing accessory and a dedicated tool could be provided with various types of mating attachment members, allowing the accessory to be selectively attached to the tool and removed for other uses, both as described above and in various other ways.

Additionally, while described above as specifically mounted to either a handle of a tool or a head, various methods of attaching the accessory both to the handle, head, and various other parts of a tool will be apparent. Furthermore, while specific types of tools and devices are described above, the accessory could be used with virtually any type of tool or device, or attached to various portions of the body of a user, a toolbox, a tool belt, or in other locations, and could be mounted either externally to the tool, or internally in a body, head, handle, or other component of the tool.

Although preferred embodiments have therefore been shown and described, it will be apparent to one of ordinary skill in the art that a number of modifications could be made to the method and apparatus described without departing from the scope of the invention. It should be understood, therefore, that the methods and apparatuses described above are only illustrative and do not limit the scope of the invention, and that various modifications could be made by those skilled in the art that would fall within the scope of the invention.

What is claimed is:

1. A hand tool, comprising:
   a tool head;
   a handle, wherein the handle is coupled to the tool head to provide a user interface for the tool head; and
   a detachable non-contact voltage sensing accessory, adapted to be coupled to and to interfit with at least a portion of one of the tool head and the handle, the non-contact voltage sensing accessory comprising a housing, a non-contact voltage sensing circuit received in the housing, and at least one indicator providing an alarm signal indicating that the hand tool is in proximity to a live electrical wire.

2. The hand tool of claim 1, further comprising a coupling device for coupling the housing of the detachable non-contact voltage sensing accessory to at least one of the tool head and the handle.

3. The hand tool of claim 1, wherein the handle includes a flange and the housing of the detachable non-contact voltage sensing accessory includes a mating slot sized and dimensioned to be received on the flange of the handle.

4. The hand tool as defined in claim 1, wherein the mating slot further comprises a lip for contacting the flange when the accessory is received on the handle.

5. The hand tool as defined in claim 1, wherein the detachable non-contact voltage sensing accessory includes at least one aperture sized and dimensioned to be received on the tool head.

6. The hand tool as defined in claim 1, wherein the handle of the hand tool includes an aperture sized and dimensioned to receive the non-contact voltage sensing accessory for storage.

7. The hand tool as defined in claim 1, wherein the non-contact voltage sensing accessory further comprises a clip for removably coupling the non-contact voltage sensing accessory to a worker for storage.

8. The hand tool as defined in claim 1, wherein the non-contact voltage sensing circuit is selectively removable from the housing.

9. The hand tool as defined in claim 1, wherein the tool head comprises an attachment member for receiving at least one of a detachable tool head and the detachable non-contact voltage sensor accessory.

10. The hand tool as defined in claim 9, wherein the attachment member comprises at least one second prong extending from the handle, the prong being adapted to interchangeably receive the tool head and the non-contact voltage sensing accessory.

11. The hand tool as defined in claim 10, wherein the handle comprises first and second blades pivotally coupled together, the attachment member comprises a first prong extending from the first blade and a second prong extending from the second blade, and the tool head comprises one of a pliers and a wire cutter.

12. The hand tool as defined in claim 1, wherein an input to the non-contact voltage sensing circuit extends through the housing and is coupled to the tool head, wherein the tool head provides an antenna for the non-contact voltage sensing circuit.

* * * * *

UNITED STATES PATENT AND TRADEMARK OFFICE
CERTIFICATE OF CORRECTION

PATENT NO. : 7,468,674 B2  Page 1 of 1
APPLICATION NO. : 11/458596
DATED : December 23, 2008
INVENTOR(S) : Onachilla et al.

It is certified that error appears in the above-identified patent and that said Letters Patent is hereby corrected as shown below:

Column 12, Line 22, Claim 4:
claim "1"
should be claim --3--

Column 12, Line 44, Claim 10:
Delete "second"

Column 12, Line 48, Claim 11:
claim "10"
should be claim --9--

Signed and Sealed this

Sixteenth Day of March, 2010

David J. Kappos
*Director of the United States Patent and Trademark Office*